(12) United States Patent
Hara et al.

(10) Patent No.: US 8,778,730 B2
(45) Date of Patent: Jul. 15, 2014

(54) PROCESS FOR PRODUCTION OF CIRCUIT BOARD

(75) Inventors: Yoshihito Hara, Osaka (JP); Yukinobu Nakata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/522,778

(22) PCT Filed: Oct. 25, 2010

(86) PCT No.: PCT/JP2010/068803
§ 371 (c)(1),
(2), (4) Date: Jul. 18, 2012

(87) PCT Pub. No.: WO2011/089767
PCT Pub. Date: Jul. 28, 2011

(65) Prior Publication Data
US 2012/0298988 A1    Nov. 29, 2012

(30) Foreign Application Priority Data
Jan. 21, 2010  (JP) ................................. 2010-011368

(51) Int. Cl.
*H01L 21/00*  (2006.01)
*H01L 21/02*  (2006.01)
*H01L 29/10*  (2006.01)
*H01L 29/786*  (2006.01)

(52) U.S. Cl.
CPC .... *H01L 21/02554* (2013.01); *H01L 21/02565* (2013.01); *H01L 29/7869* (2013.01)
USPC ........................................... 438/104; 257/43

(58) Field of Classification Search
CPC ..... H01L 29/7869; H01L 21/00; H01L 21/16; H01L 21/02554; H01L 21/02565; H01L 29/4908; H01L 29/41733
USPC ........ 257/43, 59, 72, 213, E21.412; 438/104, 438/142, 584, 597
See application file for complete search history.

(56) References Cited

U.S. PATENT DOCUMENTS 6,096,438 A * 8/2000 Takagi et al. ............... 428/472.2
7,910,490 B2 * 3/2011 Akimoto et al. ............. 438/722
(Continued)

FOREIGN PATENT DOCUMENTS

| JP | 2007-123861 A | 5/2007 |
| JP | 2008-277326 A | 11/2008 |

(Continued)

OTHER PUBLICATIONS

Official Communication issued in International Patent Application No. PCT/JP2010/068803, mailed on Jan. 11, 2011.

*Primary Examiner* — Nickolay Yushin
(74) *Attorney, Agent, or Firm* — Keating & Bennett, LLP

(57) ABSTRACT

The present invention provides a highly reliable circuit board that includes TFTs a semiconductor layer of which is formed from an oxide semiconductor; and low-resistance aluminum wirings. The circuit board of the present invention includes an oxide semiconductor layer; source wirings; and drain wirings, wherein each of the source wirings and the drain wirings includes a portion in contact with the semiconductor layer, portions of the source wirings in contact with the semiconductor layer and respective portions of the drain wirings in contact with the semiconductor layer spacedly facing each other, and the source wirings and the drain wirings are formed by stacking a layer formed from a metal other than aluminum and a layer containing aluminum.

9 Claims, 15 Drawing Sheets

(56) References Cited

U.S. PATENT DOCUMENTS

| | | |
|---|---|---|
| 2007/0072439 A1 | 3/2007 | Akimoto et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0239335 A1 | 9/2009 | Akimoto et al. |
| 2009/0305461 A1 | 12/2009 | Akimoto et al. |
| 2010/0044703 A1 | 2/2010 | Yabuta et al. |
| 2010/0085499 A1* | 4/2010 | Hirato .............................. 349/39 |
| 2010/0136743 A1 | 6/2010 | Akimoto et al. |
| 2011/0104851 A1 | 5/2011 | Akimoto et al. |
| 2011/0117697 A1 | 5/2011 | Akimoto et al. |
| 2011/0121290 A1 | 5/2011 | Akimoto et al. |
| 2011/0163311 A1 | 7/2011 | Akimoto et al. |
| 2011/0227087 A1* | 9/2011 | Moriwaki et al. .............. 257/71 |

FOREIGN PATENT DOCUMENTS

| | | | | |
|---|---|---|---|---|
| WO | WO2008/152830 | * | 12/2008 | ............ G02F 1/1343 |
| WO | WO 2010/061778 | * | 3/2010 | ................ G09F 9/30 |

* cited by examiner

PROCESS FOR PRODUCTION OF CIRCUIT BOARD

TECHNICAL FIELD

The present invention relates to a circuit board, a display device, and a process for producing a circuit board. More specifically, the present invention relates to a circuit board used as a component of an electronic device such as a display device; a display device; and a process for producing a circuit board.

BACKGROUND ART

A circuit board has an electronic circuit as its component, and a circuit board including elements such as thin-film transistors (TFTs), for example, is widely used as a component of an electronic device such as a liquid crystal display device, an organic electroluminescent display device, and a solar battery.

Hereinafter, a circuit board is illustrated based on an example of a circuit configuration of a TFT array substrate constituting a TFT-driven liquid crystal display panel. A TFT array substrate has a pixel circuit that has a structure in which TFTs (switching elements) are disposed at intersections of m×n matrix wirings with m rows of scanning lines and n columns of signal lines. The drain wirings of the TFTs are connected to picture element electrodes. Also, peripheral circuits such as a scanning driver IC and a data driver IC are respectively connected to the gate wirings and source wirings of the TFTs. For the wirings, low-resistance aluminum wirings are often used.

A circuit is affected by the performance of TFTs formed on a TFT substrate. That is, the performance of TFTs formed on a TFT substrate varies according to the material of the TFTs, and thus the circuit formed on the TFT substrate affects whether the circuit can be driven by the TFTs formed on the circuit board, whether the circuit size is not large, whether the yield does not decrease, and the like. Although a—Si (amorphous silicon) is used in many cases for conventional circuit boards in that TFTs can be easily formed at low cost, a—Si has low electron mobility. For this reason, a material better in electronic properties has been desired.

Regarding other semiconductor compounds usable for a channel layer of a TFT, Patent Document 1, for example, discloses a thin-film transistor that has an oxide semiconductor containing one element selected from In, Ga, and Zn as its channel layer.

CITATION LIST

Patent Literature

Patent Literature 1: JP 2008-277326 A

SUMMARY OF INVENTION

Technical Problem

However, a semiconductor layer is not resistant to wet etching whereas a—Si is resistant to wet etching, in the case of employing an oxide semiconductor as a semiconductor layer for an increase in the electron mobility. Hence, at least a part of the oxide semiconductor is removed by the etching solution for aluminum which is used in a mask process (e.g., a five-sheet mask process with a channel etching process) in production of a circuit board including low-resistance aluminum wirings. Accordingly, such a circuit board can be further improved in terms of increasing reliability. Here, the five-sheet mask process includes the steps of, for example, (1) performing etching using a first mask to form gate wirings; (2) performing etching using a second mask to form a semiconductor layer; (3) performing etching using a third mask to form a conductor layer, and then separating the layer into source electrodes and drain electrodes (this step is also referred to as a "channel etching process" or a "channel separation process" herein); (4) performing etching using a fourth mask to form an insulating film layer and an organic insulating film, and then forming contact holes; and (5) performing etching using a fifth mask to form picture element electrodes.

FIG. 12 is a schematic cross-sectional view illustrating a substrate on which gate wirings are formed in a process for producing a conventional circuit board. From the left side of the drawing, the respective portions indicate a TFT portion, a storage capacitance (Cs) portion, a connecting portion, and a terminal portion in the circuit board. In each portion, a gate wiring 113 is formed.

FIG. 13 is a schematic cross-sectional view illustrating the substrate on which a semiconductor layer is further formed in the process for producing a conventional circuit board. An insulating layer 115 has been further formed on the substrate illustrated in FIG. 12, and an oxide semiconductor layer 117 has been formed in each of the TFT portion and the terminal portion.

FIG. 14 is a schematic cross-sectional view illustrating the substrate after wet etching of a layer containing aluminum in the process for producing a conventional circuit board. A layer 119 containing aluminum has been further formed on the substrate illustrated in FIG. 13, and the layer 119 containing aluminum has been then wet-etched by the mask process. In the portions from which the layer 119 containing aluminum has been removed by wet etching, parts of the oxide semiconductor layer 117 have been lost and the layer has become thinner.

FIG. 15 is a schematic cross-sectional view illustrating the substrate on which an organic insulating film is further formed in the process for producing a conventional circuit board. An insulating layer 121 has been further formed on the substrate illustrated in FIG. 14, and then an organic insulating film 123 has been formed on the insulating layer 121. After that, contact holes have been formed by dry etching in the storage capacitance (Cs) portion, the connecting portion, and the terminal portion.

FIG. 16 is a schematic cross-sectional view illustrating a substrate on which picture element electrodes are further formed in the process for producing a conventional circuit board. Picture electrodes 131 have been further formed on the circuit board illustrated in FIG. 15.

As described above, at least a part or all of the oxide semiconductor layer 117 is lost because of the wet etching of the layer 119 containing aluminum in the conventional circuit board. For this reason, conventional circuit boards can be further improved in terms of sufficiently increasing the reliability.

The present invention has been made in view of the above state of the art, and aims to provide a reliable circuit board that includes TFTs a semiconductor layer of which is formed from an oxide semiconductor; and low-resistance aluminum wirings.

Solution to Problem

The present inventors have made various studies on highly reliable circuit boards, and have focused on the phenomenon that, in a circuit board in which a semiconductor layer is formed from an oxide semiconductor, the oxide semiconductor in the TFT portions, terminal portions and so on of the circuit board is lost because of the etching solution for aluminum wirings. The loss of the oxide semiconductor has been found to lead to insufficient reliability of the circuit board. Also, the present inventors have found that the loss of the oxide semiconductor because of the etching solution in production of a circuit board can be prevented and the reliability can be increased, in the case that the wirings are formed by stacking a layer formed from a metal other than aluminum and a layer containing aluminum in the TFT portions of the circuit board, and that each of the source wirings and the drain wirings includes a portion in contact with the semiconductor layer, portions of the source wirings in contact with the semiconductor layer and respective portions of the drain wirings in contact with the semiconductor layer spacedly facing each other. The findings have solved the above problem admirably, and thereby the present invention has been completed.

That is, the present invention is a circuit board including: an oxide semiconductor layer; source wirings; and drain wirings, wherein each of the source wirings and the drain wirings includes a portion in contact with the semiconductor layer, portions of the source wirings in contact with the semiconductor layer and respective portions of the drain wirings in contact with the semiconductor layer spacedly facing each other, and the source wirings and the drain wirings are formed by stacking a layer formed from a metal other than aluminum and a layer containing aluminum.

The circuit board of the present invention having the above structure is produced through a channel etching process of etching the layer containing aluminum and then etching the layer formed from a metal other than aluminum. In the later part of the etching, dry etching can be employed in place of the wet etching for aluminum. Use of dry etching enables to minimize the loss of the oxide semiconductor. Therefore, the reliability can be sufficiently increased regarding a circuit board that includes TFTs the semiconductor layer of which is formed from an oxide semiconductor; and low-resistance aluminum wirings.

The layer containing aluminum is preferably formed from aluminum, an aluminum alloy, Mo/Al, or a Mo/Al alloy, for example. The Al alloy is an alloy that the main component of which is Al—Ni, Al—Nd, Al—Co, or Al—Si, for example. The thickness of the layer is, for example, 50 nm to 400 nm.

The layer formed from a metal other than aluminum is preferably one that is resistant to an etchant for the layer containing aluminum and can go through dry etching. For example, metals such as Ti, Ta, and W are preferred. The thickness of the layer is preferably 10 nm to 100 nm so that the dry etching time is shortened to reduce damage to the base.

Examples of the oxide semiconductor layer include crystalline oxide semiconductor layers such as ZnO layers, and amorphous oxide semiconductor layers such as IGZO (indium gallium zinc oxide) layers. Among these, amorphous oxide semiconductor layers are preferred. These amorphous oxide semiconductor layers are lost by a mixed solution (used in general etching for Al) of phosphoric acid+nitric acid+acetic acid.

As long as the circuit board of the present invention essentially includes these components, the structure of the circuit board of the present invention is not particularly limited by other components.

Preferred structures of the circuit board of the present invention are described in detail below.

A preferred structure of the circuit board of the present invention is a structure in which the layer formed from a metal other than aluminum includes at least one selected from the group consisting of titanium, tantalum, and tungsten. This structure enables easy dry etching, which enables to achieve the effects of the present invention sufficiently. A more preferred structure is a structure in which the layer formed from a metal other than aluminum consists of at least one selected from the group consisting of titanium, tantalum, and tungsten.

Another preferred structure of the circuit board of the present invention is a structure in which the circuit board is a thin-film transistor array substrate. The thin-film transistor array substrate has thin-film transistors (TFTs) on the circuit board.

Another aspect of the present invention is a display device including the circuit board of the present invention. Examples of the display device include liquid crystal display devices and EL display devices such as organic EL display devices and inorganic EL display devices.

Yet another aspect of the present invention is a process for producing a circuit board that includes an oxide semiconductor layer, source wirings, and drain wirings, the process including: an oxide semiconductor formation step of forming an oxide semiconductor layer; a conductor layer formation step of forming a conductor layer by stacking a layer formed from a metal other than aluminum and a layer containing aluminum; and a treatment step of treating the layer containing aluminum by wet etching, and then treating the layer formed from a metal other than aluminum by dry etching, wherein the treatment step includes separating the conductor layer into source wirings and drain wirings such that portions of the source wirings in contact with the semiconductor layer and respective portions of the drain wirings in contact with the semiconductor layer spacedly face each other.

The process for producing the circuit board of the present invention employs dry etching in place of wet etching in the later part of the etching in the channel etching process, and the use of dry etching minimizes the loss of the exposed oxide semiconductor. Therefore, the reliability can be sufficiently increased regarding a circuit board that includes TFTs the semiconductor layer of which is formed from an oxide semiconductor; and low-resistance aluminum wirings.

The conductor layer formation step is enough if the step includes formation of a conductor layer as a pre-step of the treatment step of separating the conductor layer into source wirings and drain wirings through etching.

A preferred structure of the process for producing the circuit board of the present invention is the same as the above preferred structure of the circuit board of the present invention.

The above structures may be appropriately combined as long as the combination does not go beyond the scope of the present invention.

Advantageous Effects of Invention

The present invention enables to sufficiently increase the reliability regarding a circuit board that includes TFTs the semiconductor layer of which is produced from an oxide semiconductor; and low-resistance aluminum wirings.

DESCRIPTION OF EMBODIMENTS

Figure 2:
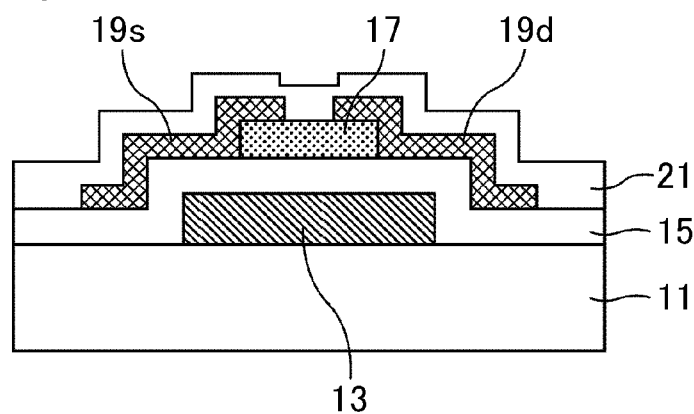
FIG. 2 is a schematic cross-sectional view illustrating a TFT portion in the circuit board of the first embodiment.

The condition of "portions of the source wirings in contact with the semiconductor layer and respective portions of the drain wirings in contact with the semiconductor layer spacedly facing each other" mentioned herein is satisfied as long as a surface of each source wiring in a portion in contact with the semiconductor layer and a surface of a drain wiring in a portion in contact with the semiconductor layer are disposed in parallel with each other without direct contact as shown in FIG. 2, for example.

Since the circuit board is a substrate on which TFTs are formed in the embodiment, the circuit board is also referred to as a TFT-side substrate. Since a substrate facing the circuit board is a substrate on which color filters (CFs) are formed in the embodiment, the substrate facing the circuit board is also referred to as a CF-side substrate.

The present invention will be described in more detail below with reference to the drawings based on an embodiment which, however, is not intended to limit the scope of the present invention.

First Embodiment

Figure 1:
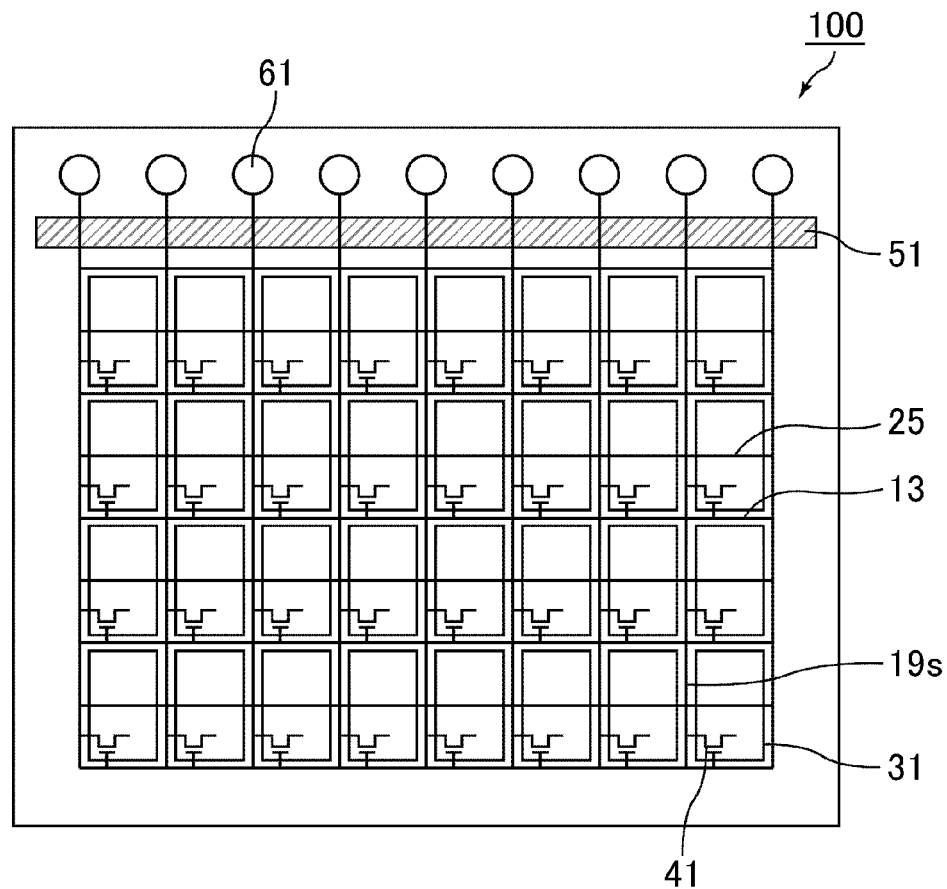
FIG. 1 is a schematic plan view illustrating a circuit board of a first embodiment.

FIG. 1 is a schematic plan view illustrating the circuit board of the first embodiment. A circuit board 100 is a TFT-side substrate provided with thin-film transistors (TFTs) 41, and has a picture element electrode area (display area) and an area outside the picture element electrode area (non-display area).

In the non-display area, connecting portions 51 and terminal portions 61 are arranged. Via the connecting portions 51, a source driver can be mounted on the circuit board 100 by, for example, a chip-on-glass (COG) method. Via the terminal portions 61, a flexible printed circuit board (FPC) can be mounted on the circuit board 100. For example, signals for driving the source driver can be input from the FPC via the terminal portions 61 and the connecting portions 51.

In the display area of the circuit board 100, gate wirings 13 and source wirings 19s substantially perpendicular to each other are provided on a glass substrate (not illustrated in FIG. 1), and a picture element electrode 31 and a TFT 41 are provided in each area surrounded by the gate wirings 13 and the source wirings 19s. Also, storage capacitance (Cs) wirings 25 are provided so as to overlap with picture element electrode 31 in such a manner that they are substantially parallel with the gate wirings 13.

FIG. 2 is a schematic cross-sectional view illustrating a TFT portion in the circuit board of the first embodiment. The circuit board of the first embodiment has, in each TFT portion, a gate wiring 13, an oxide semiconductor layer 17 such as an IGZO (indium gallium zinc oxide) layer, and a source wiring 19s and a drain wiring 19d formed by stacking a layer formed from a metal other than aluminum and a layer containing aluminum. Each of the source wirings 19s and the drain wirings 19d has a portion in contact with the oxide semiconductor layer 17, and portions of the source wirings 19s in contact with the oxide semiconductor layer 17 and respective portions of the drain wirings 19d in contact with the oxide semiconductor layer 17 spacedly face each other. In the circuit board of the present embodiment having the above structure, a channel etching process is performed in which etching of the layer containing aluminum is performed first and then etching of the layer formed from a metal other than aluminum is performed. In the later part of the etching, dry etching can be employed in place of the wet etching, and dry etching enables to minimize the loss of the oxide semiconductor. Therefore, the reliability can be sufficiently increased regarding a circuit board that includes TFTs the semiconductor layer of which is formed from an oxide semiconductor; and low-resistance aluminum wirings.

Any solution can be used for wet etching as long as it enables etching of aluminum. A solution enabling etching of aluminum usually results in a loss of the oxide semiconductor, and thus application of the present invention to a circuit board produced using such a solution is expected to achieve advantageous effects of the present invention. Examples of the solution include strong acid, weak acid, and strong alkali. Since the oxide semiconductor layer 17 is etched even with weak alkali in the case that the oxide semiconductor layer 17 is of ZnO or the like metal other than IGZO, the present invention can also be applied to a circuit board obtained using a weak alkali in this case. Among these solutions, a mixed solution (used in general etching of aluminum) of phosphoric acid+nitric acid+acetic acid is preferred.

Suitable examples of the oxide semiconductor layer 17 other than an IGZO layer include ISZO (In—Si—Zn—O), IAZO (In—Al—Zn—O), INiZO (In—Ni—Zn—O), ICuZO (In—Cu—Zn—O), IHfZO (In—Hf—Zn—O), and IZO (In—Zn—O) layers.

The steps of producing the circuit board of the first embodiment are described below with reference to FIGS. 3 to 9.

Figure 3:
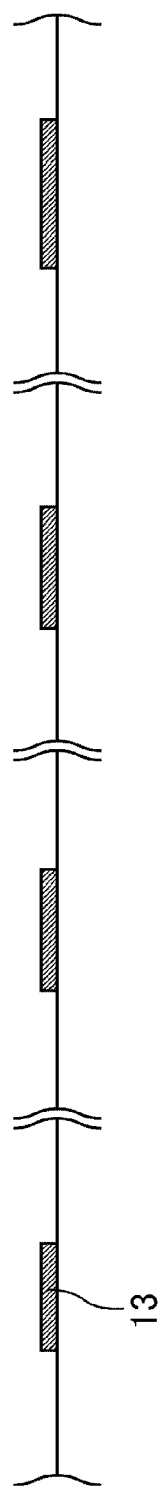
FIG. 3 is a schematic cross-sectional view illustrating a substrate on which gate wirings have been formed in a process for producing the circuit board of the first embodiment.

FIG. 3 is a schematic cross-sectional view illustrating a substrate on which gate wirings are formed in the process for producing the circuit board of the first embodiment. From the left side of the drawing, the respective portions indicate a TFT portion, a storage capacitance (Cs) portion, the connecting portion 51, and the terminal portion 61 in the circuit board. The same applies in FIGS. 4 to 9 and FIGS. 12 to 16. In each of the TFT portion, the connecting portion, and the terminal portion, a gate wiring 13 is formed.

Figure 4:
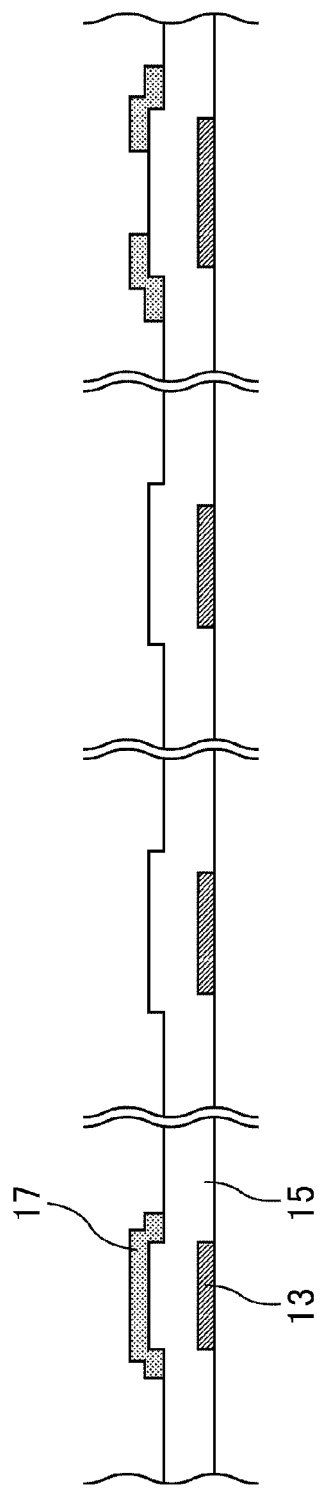
FIG. 4 is a schematic cross-sectional view illustrating the substrate on which a semiconductor layer is further formed in the process for producing the circuit board of the first embodiment.

FIG. 4 is a schematic cross-sectional view illustrating the substrate on which a semiconductor layer is further formed in the process for producing the circuit board of the first embodiment. An insulating layer 15 has been further formed on the substrate illustrated in FIG. 3, and an oxide semiconductor layer 17 has been formed in each of the TFT portion and the terminal portion.

Figure 5:
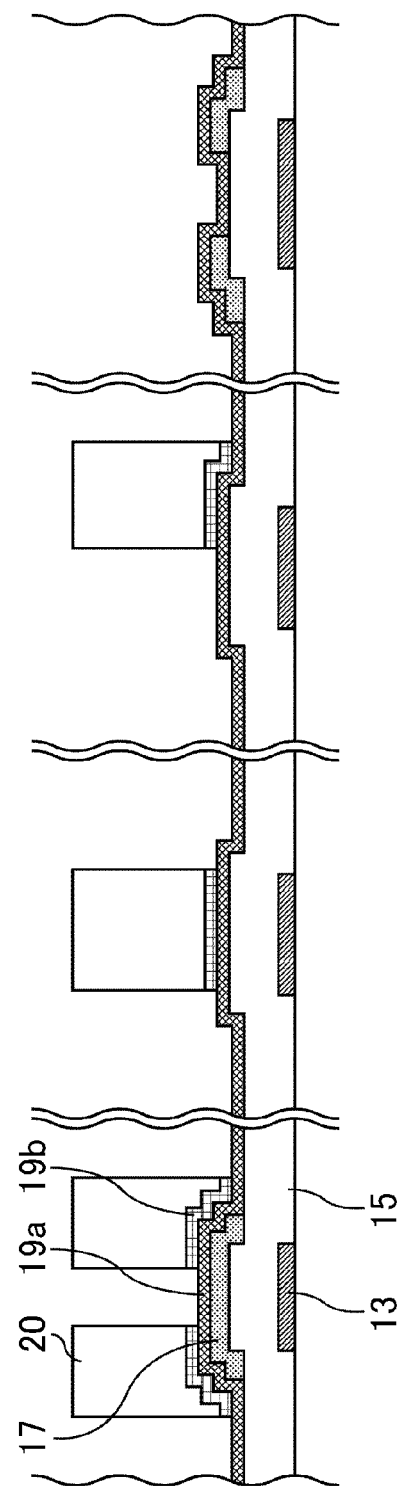
FIG. 5 is a schematic cross-sectional view illustrating the substrate after wet etching of a layer containing aluminum in the process for producing the circuit board of the first embodiment.

FIG. 5 is a schematic cross-sectional view illustrating the substrate after wet etching of a layer containing aluminum in the process for producing the circuit board of the first embodiment. That is, a conductor layer is further formed on the substrate illustrated in FIG. 4 by stacking a layer 19a formed from a metal other than aluminum and a layer 19b containing aluminum. On the conductor layer, a resist 20 has been formed through a mask process, so that wet etching can be performed on the layer 19b containing aluminum.

Figure 6:
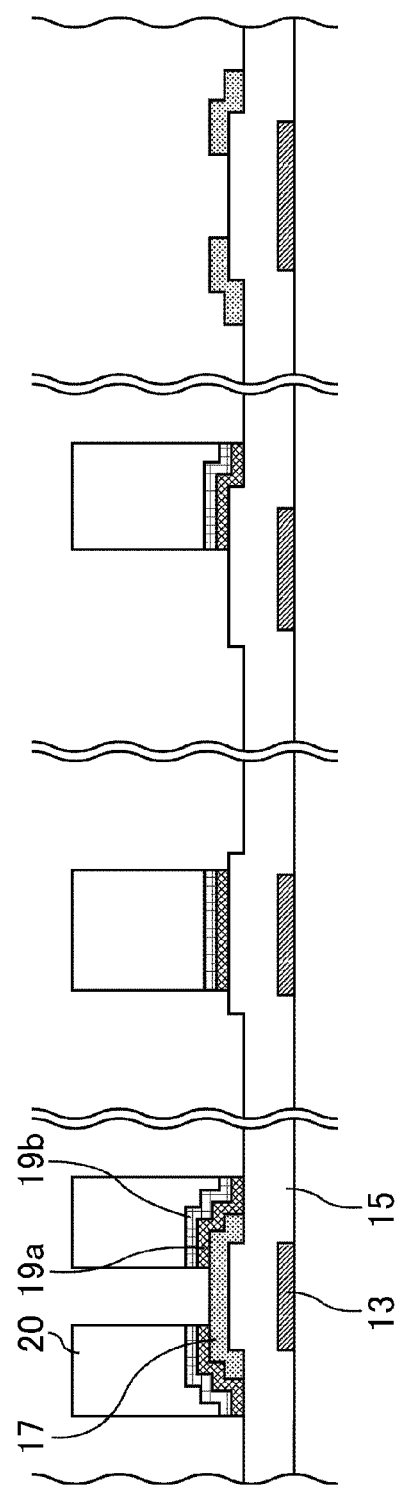
FIG. 6 is a schematic cross-sectional view illustrating the substrate after dry etching of a layer formed from a metal other than aluminum in the process for producing the circuit board of the first embodiment.

FIG. 6 is a schematic cross-sectional view illustrating the substrate after dry etching of the layer formed from a metal other than aluminum in the process for producing the circuit board of the first embodiment. In a portion from which the layer 19b containing aluminum has been removed (in other words, a portion with no resist 20 formed), the layer 19a formed from a metal other than aluminum has been further subjected to dry etching. The oxide semiconductor layer 17 has only received the minimum damage by dry etching, and is not lost substantially.

The conductor layer (source wirings and drain wirings) illustrated in the present embodiment may include two layers or three or more layers, but preferably includes two layers or three layers. For example, the layer preferably has a multi-layer structure of Al (aluminum)/Ti (titanium), Mo (molybdenum)/Al (aluminum)/Ti (titanium), Al alloy/Mo (molybdenum)/Ti, Al alloy/Ti, Al alloy/Ta (tantalum), or Al alloy/W (tungsten). The thickness of the layer containing aluminum can be 50 nm to 400 nm. Also, the thickness of the layer formed from a metal other than aluminum can be 10 nm to 100 nm. As mentioned above, the upper layer aluminum is processed through a wet etching process, and then Ti, Ta, W, or the like is processed through a dry process.

Figure 7:
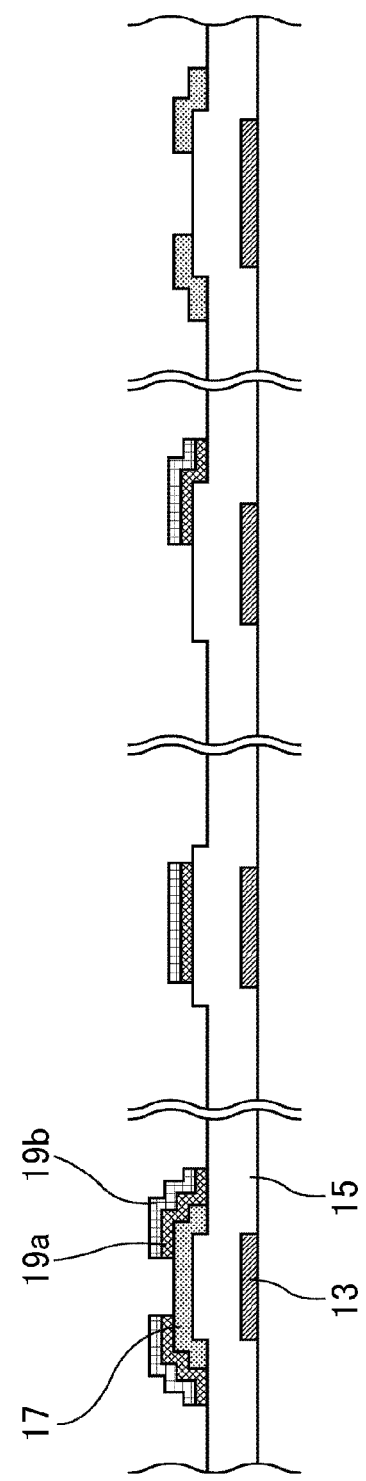
FIG. 7 is a schematic cross-sectional view illustrating the substrate after removal of a resist in the process for producing the circuit board of the first embodiment.

FIG. 7 is a schematic cross-sectional view illustrating the substrate after removal of a resist in the process for producing the circuit board of the first embodiment. The resist has been removed from the substrate illustrated in FIG. 6.

Figure 8:
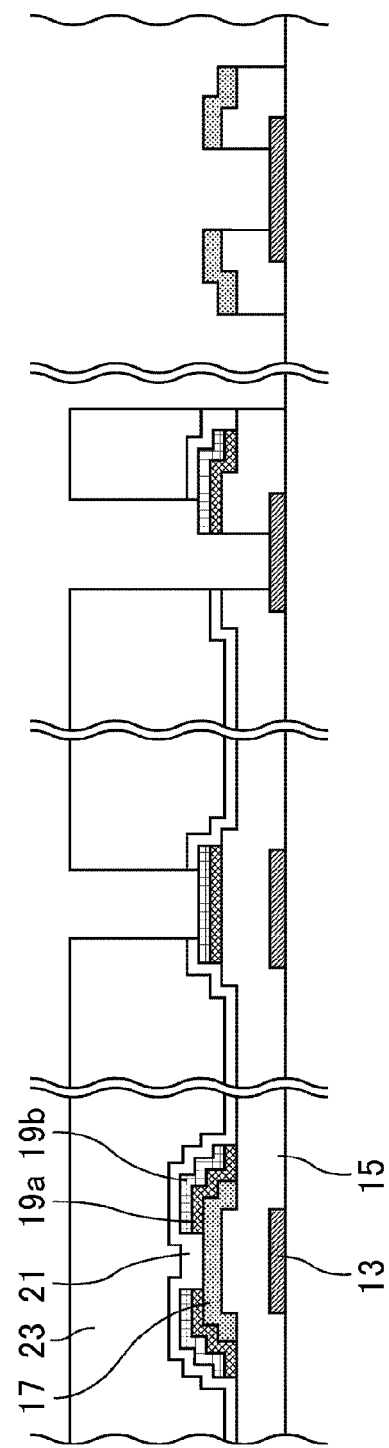
FIG. 8 is a schematic cross-sectional view illustrating the substrate on which an organic insulating film is further formed in the process for producing the circuit board of the first embodiment.

FIG. 8 is a schematic cross-sectional view illustrating the substrate on which an organic insulating film is further formed in the process for producing the circuit board of the first embodiment. An insulating layer 21 has been further formed on the substrate illustrated in FIG. 7, and then an organic insulating film 23 has been formed on the insulating layer 21. After that, contact holes have been formed by dry etching in the storage capacitance (Cs) portion, the connecting portion, and the terminal portion.

Figure 9:
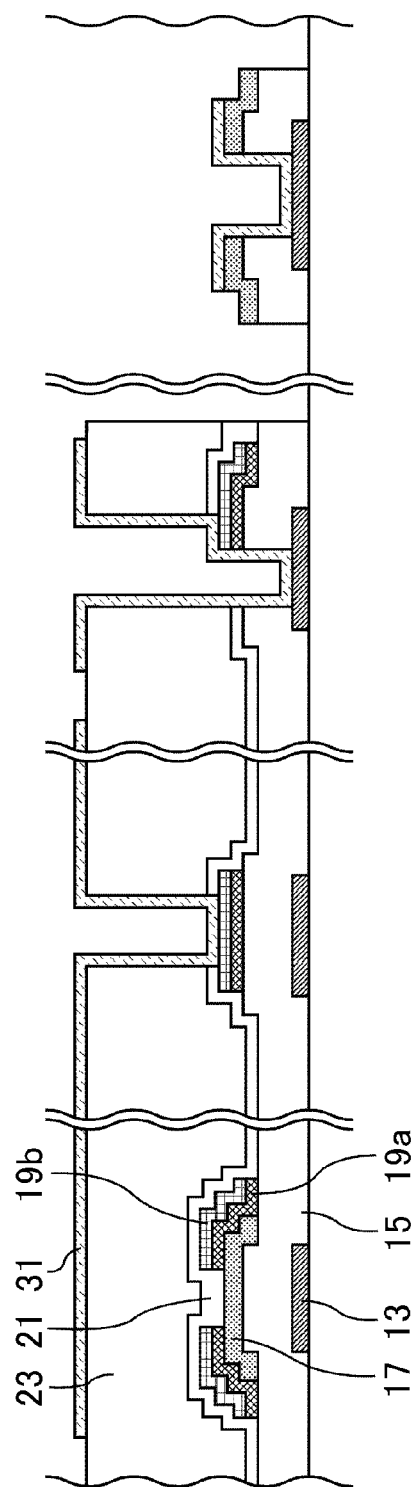
FIG. 9 is a schematic cross-sectional view illustrating the substrate on which picture elements are formed in the process for producing the circuit board of the first embodiment.

FIG. 9 is a schematic cross-sectional view illustrating the substrate on which picture element electrodes are further formed in the process for producing the circuit board of the first embodiment. Picture electrodes 31 have been further formed on the circuit board illustrated in FIG. 8.

Thereby, wirings including a low-resistance aluminum (alloy) layer can be suitably produced through the five-sheet mask process. That is, a loss of the oxide semiconductor in a TFT portion of a circuit board because of the etching solution in production of a circuit board can be prevented to increase the reliability, in the case that the wirings are formed by stacking a layer formed from a metal other than aluminum and a layer containing aluminum, and that each of the source wirings and the drain wirings includes a portion in contact with the semiconductor layer, and portions of the source wirings in contact with the semiconductor layer and respective portions of the drain wirings in contact with the semiconductor layer spacedly face each other.

Figure 10:
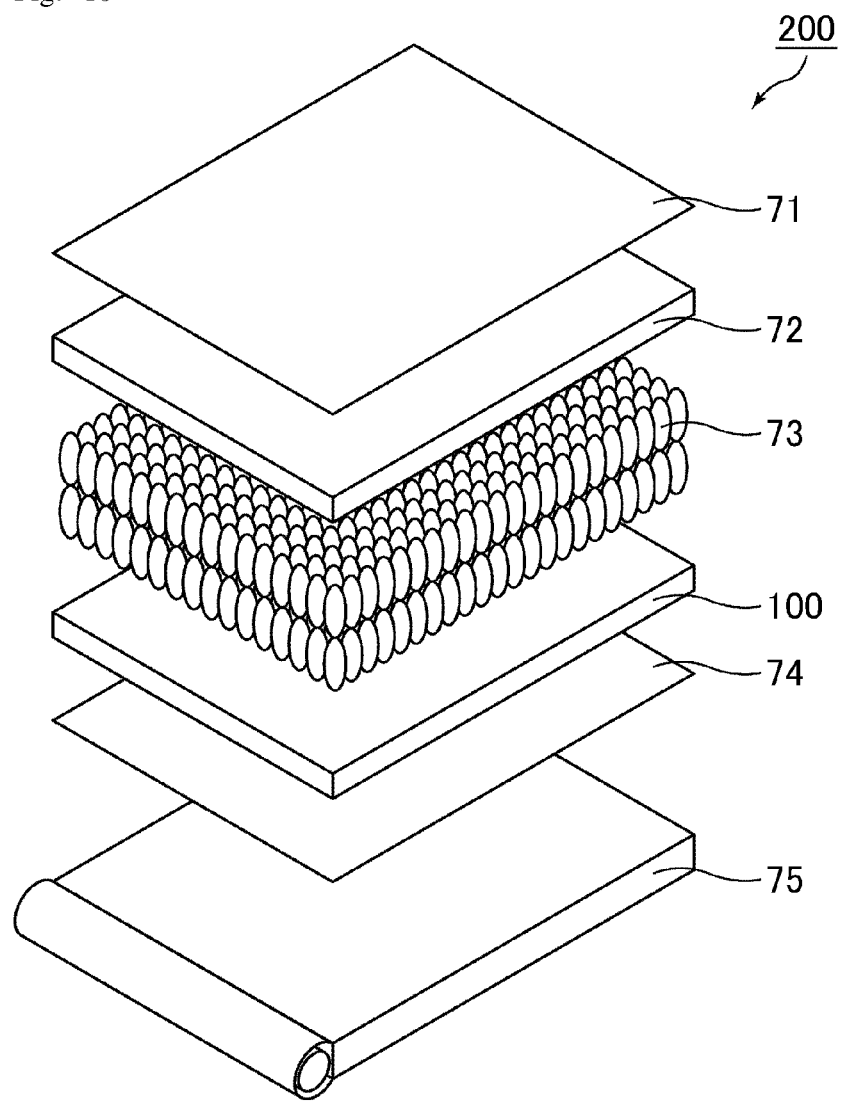
FIG. 10 is an exploded perspective view schematically illustrating the structure of a liquid crystal panel that includes the circuit board of the first embodiment.

FIG. 10 is an exploded perspective view schematically illustrating the structure of a liquid crystal panel that includes the circuit board of the first embodiment.

As illustrated in FIG. 10, liquid crystals 73 are sandwiched by a CF-side substrate 72 and the circuit board 100 in a liquid crystal panel 200. The liquid crystal panel 200 also has a backlight 75 on the backside of the circuit board 100. The light of the backlight 75 passes through a polarizer 74, the circuit board 100, the liquid crystals 73, the CF-side substrate 72, and a polarizer 71 in the stated order, and transmission and non-transmission of light is controlled by alignment control of the liquid crystals.

Figure 11:
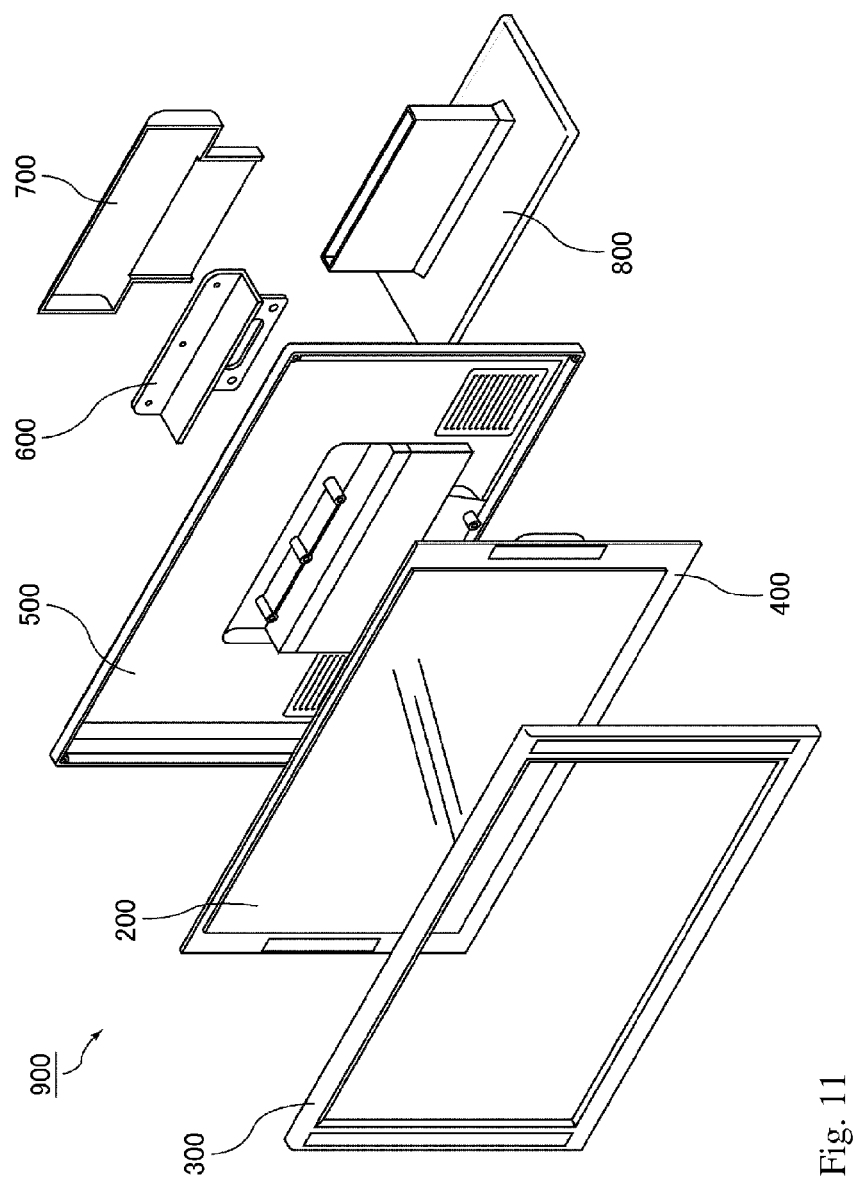
FIG. 11 is an exploded perspective view schematically illustrating the structure of a liquid crystal display device that includes the liquid crystal panel illustrated in FIG. 10.
Figure 12:
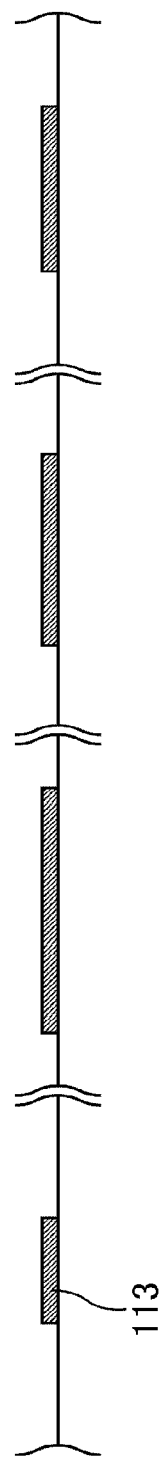
FIG. 12 is a schematic cross-sectional view illustrating a substrate on which gate wirings are formed in a process for producing a conventional circuit board.
Figure 13:
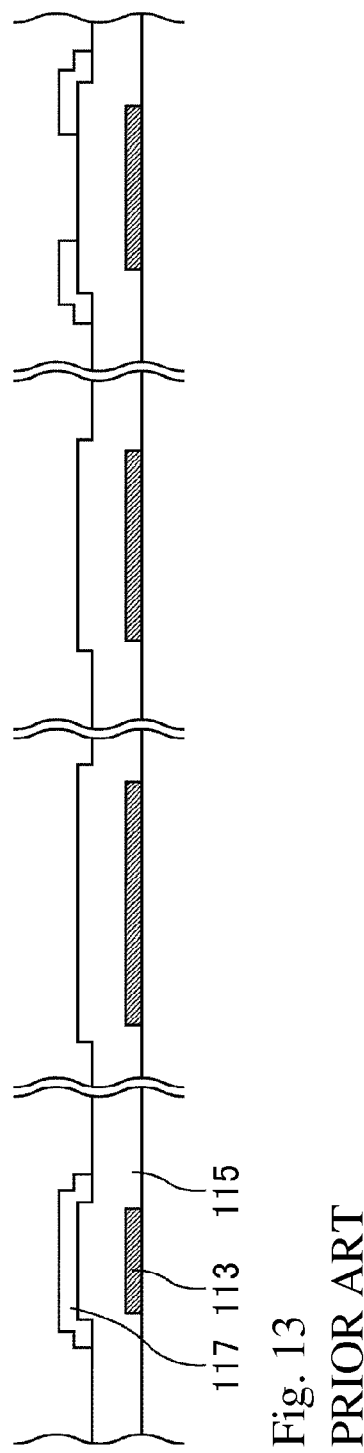
FIG. 13 is a schematic cross-sectional view illustrating the substrate on which a semiconductor layer is further formed in the process for forming a conventional circuit board.
Figure 14:
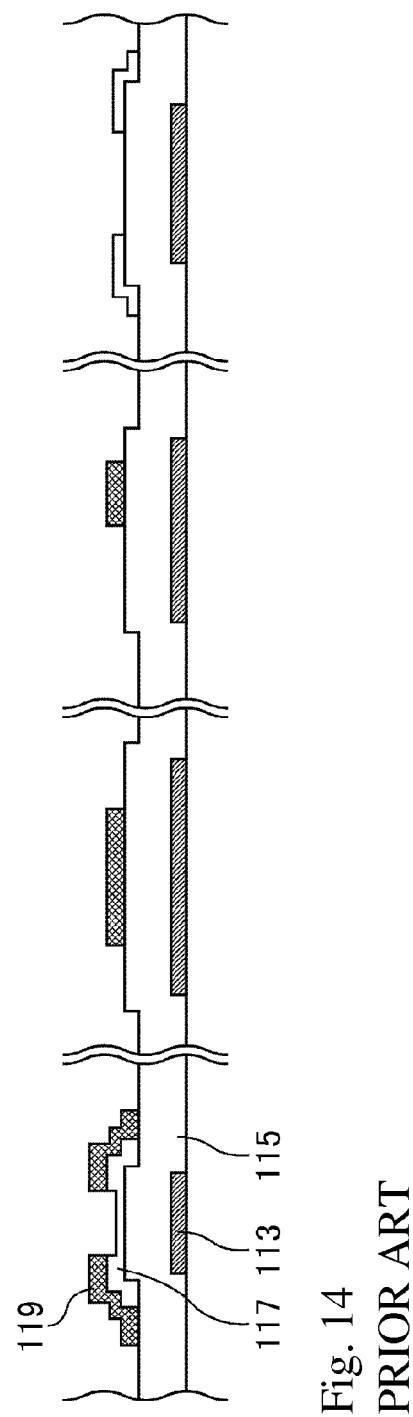
FIG. 14 is a schematic cross-sectional view illustrating the substrate after wet etching of a layer containing aluminum in the process for forming a conventional circuit board.
Figure 15:
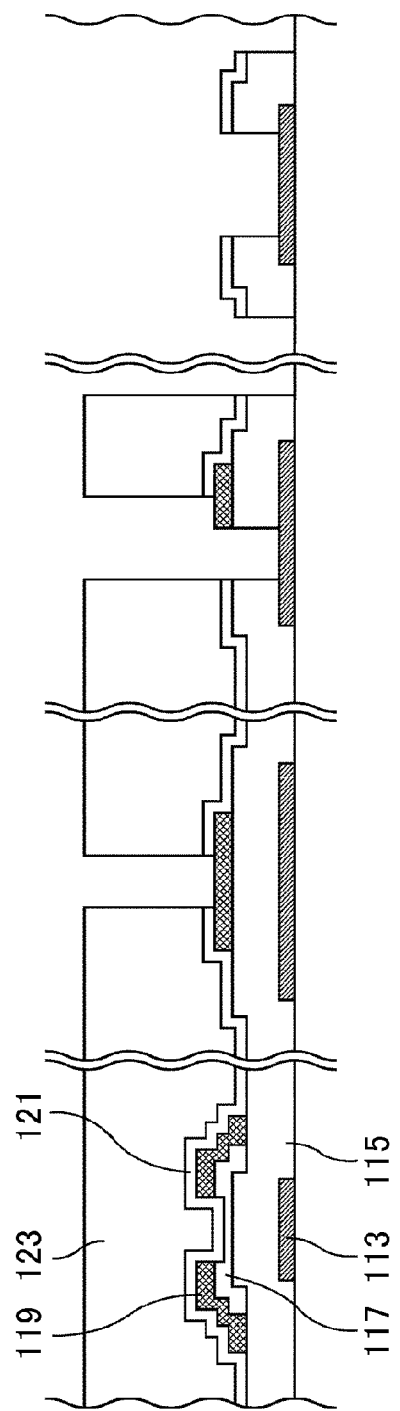
FIG. 15 is a schematic cross-sectional view illustrating the substrate on which an organic insulating film is further formed in the process for producing a conventional circuit board.
Figure 16:
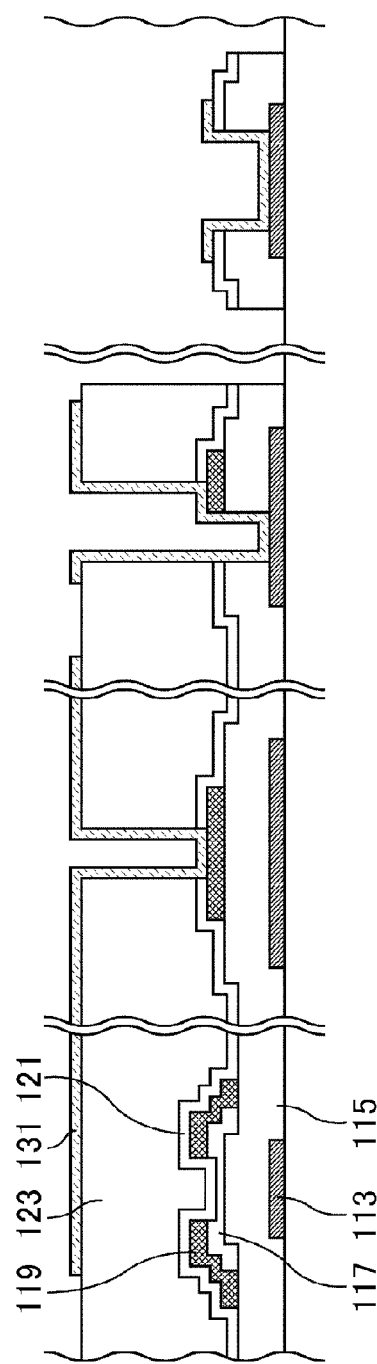
FIG. 16 is a schematic cross-sectional view illustrating the substrate on which picture elements are further formed in the process for producing a conventional circuit board.

FIG. 11 is an exploded perspective view schematically illustrating the structure of a liquid crystal display device that includes the liquid crystal panel illustrated in FIG. 10. As illustrated in FIG. 11, the liquid crystal panel 200 fixed on a fixation panel 400 is sealed by a front cabinet 300 and a back cabinet 500. The back cabinet 500 and an upper stand 700 are fixed to each other via a metal fitting 600. The upper stand 700 and a lower stand 800 are fitted with each other.

The structures in the above embodiment may be appropriately combined as long as the combination does not go beyond the scope of the present invention.

The present application claims priority to Patent Application No. 2010-011368 filed in Japan on Jan. 21, 2010 under the Paris Convention and provisions of national law in a designated State, the entire contents of which are hereby incorporated by reference.

EXPLANATION OF SYMBOLS

11: Glass Substrate
13, 113: Gate wiring
15, 21, 115, 121: Insulating layer
17, 117: Oxide semiconductor layer
19s: Source wiring
19d: Drain wiring
19a: Layer formed from metal other than aluminum
19b, 119: Layer containing aluminum
20: Resist
23, 123: Organic insulating film
25: Cs (storage capacitance) wiring
31, 131: Picture element electrode
41: TFT
51: Connecting portion
61: Terminal portion
71, 74: Polarizer 72: CF-side substrate
73: Liquid crystal
75: Backlight
100: Circuit board
200: Liquid crystal panel
300: Front cabinet
400: Fixation panel
500: Back cabinet
600: Metal fitting
700: Upper stand
800: Lower stand
900: Liquid crystal display device

The invention claimed is:

1. A process for producing a circuit board that includes an oxide semiconductor layer, source wirings, and drain wirings, the process comprising:
   an oxide semiconductor formation step of forming an oxide semiconductor layer;
   a conductor layer formation step of forming a conductor layer by stacking a layer formed from a metal other than aluminum and a layer containing aluminum; and
   a treatment step of treating the layer containing aluminum by wet etching, and then treating the layer formed from a metal other than aluminum by dry etching, wherein
   the treatment step includes separating the conductor layer into source wirings and drain wirings such that portions of the source wirings in contact with the semiconductor layer and respective portions of the drain wirings in contact with the semiconductor layer spacedly face each other; and
   when treating the layer formed from a metal other than aluminum by dry etching, the dry etching is performed such that the oxide semiconductor layer is not substantially damaged or removed while the layer formed from a metal other than aluminum is etched.

2. The process for producing a circuit board according to claim 1,
   wherein the oxide semiconductor layer is formed from indium gallium zinc oxide.

3. The process for producing a circuit board according to claim 2,
   further comprising:
   a resist formation step of forming a resist layer on the conductor layer through a mask process, wherein
   both the wet etching and the dry etching are performed using the resist layer.

4. The process for producing a circuit board according to claim 2,
   wherein a thickness of the layer containing aluminum is 50 nm to 400 nm.

5. The process for producing a circuit board according to claim 2,
   wherein the layer formed from a metal other than aluminum is resistant to an etchant used in the wet etching of the layer containing aluminum.

6. The process for producing a circuit board according to claim 2,
   wherein the layer formed from a metal other than aluminum is formed from one of Ti, Ta, and W.

7. The process for producing a circuit board according to claim 2,
   wherein a thickness of the layer formed from a metal other than aluminum is 10 nm to 100 nm.

8. The process for producing a circuit board according to claim 2,
   wherein the layer containing aluminum is formed from Al, an Al alloy, Mo/Al, or a Mo/Al alloy.

9. The process for producing a circuit board according to claim 8,
   wherein the layer containing aluminum is formed from the Al alloy and a main component of the Al alloy is Al—Ni, Al—Nd, Al—Co, or Al—Si.

* * * * *